(12) United States Patent
Hayashi et al.

(10) Patent No.: US 6,384,698 B1
(45) Date of Patent: May 7, 2002

(54) TRANSVERSE DOUBLE MODE SAW FILTER

(75) Inventors: Satoru Hayashi, Okaya; Michiaki Takagi, Tatsuno-machi; Takashi Yamazaki, Nagano-ken, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/719,836

(22) PCT Filed: Mar. 29, 2000

(86) PCT No.: PCT/JP00/01936

§ 371 Date: Dec. 21, 2000

§ 102(e) Date: Dec. 21, 2000

(87) PCT Pub. No.: WO00/67374

PCT Pub. Date: Nov. 9, 2000

(30) Foreign Application Priority Data

Apr. 28, 1999 (JP) .......................................... 11-121674

(51) Int. Cl.[7] ................................................ H03H 9/64
(52) U.S. Cl. ................... 333/195; 333/193; 310/313 B; 310/313 D
(58) Field of Search ................................ 333/193, 195; 310/313 B, 313 A, 313 R, 313 D (56) References Cited

U.S. PATENT DOCUMENTS 4,060,777 A * 11/1977 Tiersten et al. ............. 333/194
4,331,943 A * 5/1982 Cross et al. ................ 333/194

(List continued on next page.)

FOREIGN PATENT DOCUMENTS

| JP | 59-131213 A | 7/1984 | ............ H03H/9/64 |
| JP | 4-373304 | 12/1992 | ............ H03H/9/25 |
| JP | 6-216694 | 8/1994 | .......... H03H/9/145 |
| JP | 09-093079 | 4/1997 | ............ H03H/9/64 |
| JP | 10-032463 | 2/1998 | ............ H03H/9/64 |
| JP | 10-303683 | 11/1998 | .......... H03H/9/145 |

OTHER PUBLICATIONS

"Balanced Driven Transversely Coupled Waveguide Resonator Filters"; B. Wall et al.; 1996 IEEE Ultrasonics Symposium; 1996; pp. 47–51.
"A New Low Impedance Balanced Drive Structure for Saw Transversely Coupled Resonator Filters"; Marc Solal et al.; 1997 IEEE Ultrasonics Symposium; 1997; pp. 83–89.

(List continued on next page.)

Primary Examiner—Robert Pascal
Assistant Examiner—Dean Takaoka
(74) Attorney, Agent, or Firm—Oliff & Berridge, PLC (57) ABSTRACT

A transversally coupled double-mode SAW filter using a surface acoustic wave has two SAW resonators which have curtain-like electrodes and a pair of reflectors on both side thereof, respectively, and which are disposed in parallel on a piezoelectric flat plate in the propagation direction of the surface acoustic wave. The curtain-like electrodes of the SAW resonators have a first bus bar of electrically positive electrode which extends in the propagation direction of SAW and second and third bus bars of electrically negative electrode which extend in parallel on both sides of the first bus bar. The first bus bar has multiple electrode fingers of electrically positive electrode which face the second and third bus bars on both sides thereof and which extend in a direction perpendicular to the propagation direction of SAW so as to suitably have a space of $\lambda/2$, $\lambda$ being the wavelength of the surface acoustic wave, and a width of $\lambda/4$. The second and third bus bars have multiple electrode fingers of electrically negative electrode which correspond to the electrode fingers of electrically positive electrode, face the first bus bar and extend in a direction perpendicular to the propagation direction of SAW so as to similarly have a space of $\lambda/2$ and a width of $\lambda/4$. Thereby, the curtain-like electrodes are constituted to invert the direction of driving field by 180° with the first bus bar therebetween, and to enable making the passband width sharply broader than before by use of the frequency difference between excited primary symmetric mode and primary anti-symmetric mode.

10 Claims, 8 Drawing Sheets

U.S. PATENT DOCUMENTS

| | | | | |
|---|---|---|---|---|
| 4,542,356 A | * | 9/1985 | Nakazawa et al. | 333/195 |
| 5,426,339 A | | 6/1995 | Wright | 310/313 D |
| 5,592,040 A | * | 1/1997 | Yamamoto | 313/313 D |
| 5,767,603 A | * | 6/1998 | Kadota et al. | 310/313 B |
| 5,877,661 A | * | 3/1999 | Ohmura et al. | 333/193 |
| 5,932,950 A | * | 8/1999 | Yamada et al. | 310/313 D |
| 5,977,686 A | * | 11/1999 | Kadota et al. | 310/313 B |
| 5,990,762 A | * | 11/1999 | Nakamura et al. | 333/195 |
| 5,999,068 A | * | 12/1999 | Tsutsumi et al. | 333/193 |

OTHER PUBLICATIONS

"Saw Devices for Mobile Communication Applications"; Clemens C. W. Ruppel et al.; $26^{th}$ EM Symposium; May 15–16, 1997; pp. 100–101, 126–131.

"A Saw Resonator Filter Using Longitudinal and Transverse Modes"; G. Martin et al., 1996 IEEE Ultrasonics Symposium; 1996; pp. 53–57.

"A Four–Pole Saw Resonator Filter Combining Transverse and Symmetrical Longitudinal Modes"; G. Martin et al.; 1997 IEEE Ultrasonic Symposium; 1997; pp. 37–41.

"K–Cut Saw Resonator with Both Static and Dynamic Zero Temprature Coefficients"; Michiaki Takagi et al.; $25^{th}$ EM Symposium; May 23–24, 1997.

"Technical Report of the $62^{nd}$ Meeting of the $150^{th}$ Committee of Acoustic Wave Device Technology"; Michiaki Takagi; Japan Society for the Promotion of Science; May 13, 1999.

"Technical Report US 87–36"; The Institute of Electronics, Y. Suzuki et al.; Information, and Communications Engineers; Sep. 22, 1987.

"Technical Report of the $51^{st}$ Meeting of the $150^{th}$ Committee of Acoustic Wave Device Technology"; J. Tsutsumi et al.; Japan Society for the Promotion of Science; Jan. 27, 1997.

\* cited by examiner

|  | PIEZOELETRIC PLATE |
| --- | --- |
|  | REFLECTOR 1, REFLECTOR |
|  | INPUT/OUTPUT |
|  | CONNECTING CONDUCTOR, INPUT TERMINAL, OUTPUT TERMINAL |

TRANSVERSE DOUBLE MODE SAW FILTER

BACKGROUND OF THE INVENTION

1. Field of the Invention

This invention relates to a resonator-type surface acoustic wave (SAW) filter using a surface acoustic wave, and particularly, relates to a transversally coupled double-mode SAW filter in which two SAW resonators are disposed transversally and in parallel.

2. Description of Related Art

Recently, SAW filters, especially transversally coupled multi-mode resonator-type SAW filters, have been widely used as the intermediate-frequency (IF) filters of mobile communication terminals such as portable telephone because they are small, low-loss, have a narrow-band passband characteristics and also less out-of-band unwanted modes. For example, in the transversally coupled double-mode SAW filter described in Japanese unexamined patent application No. S59-131213, two SAW resonators are disposed in parallel on a piezoelectric substrate in a direction perpendicular to the propagation direction of SAW which is excited by curtain-like electrodes of the SAW resonators, i.e., inter-digital transducer (IDT) electrodes, two independent inherent vibration modes originating in the acoustic coupling of SAW, i.e., a fundamental wave symmetric mode S0 and a fundamental wave anti-symmetric mode A0 are used, and the passband width is determined by the difference between their resonance frequencies f1, f2. Particularly, when a quartz crystal substrate with excellent frequency-temperature characteristics is used, a two-stage cascade connection filter is obtained which is in a planar element the size of 2 mm×6.5 mm and has excellent characteristics of ca. 700 ppm in specific bandwidth and 5 dB in insertion loss.

SUMMARY OF THE INVENTION

More recently, digital communication modes such as GSM mode and PHS mode seem to be adopted in a portable telephone with the digitalization of communication systems, thus an even smaller IF filter with a relatively broad passband width of 1,000 ppm has been required. In aforesaid conventional two transversally coupled double-mode SAW filters, however, the resonance frequency difference of the fundamental wave symmetric mode S0 and the fundamental wave anti-symmetric mode A0 could not be more than 700 ppm at a width dimension of 7 to 9λ (λ: the wavelength of SAW) of one SAW resonator which gives a filter impedance $Z_0$ of 600–800 Ω considered appropriate before. In order to expand the passband width, the electrode finger cross width of IDT and the gap between SAW resonators must be narrowed, therefore such problems as an increase of insertion loss and deterioration of the degree of suppression of out-of-band frequency characteristics arise.

Moreover, if the IF filter is to be miniaturized, the sum M+N of the number of pairs of electrode fingers of IDT forming these SAW filters (M) and the number of conductors of one-side reflectors (N) needs to be decreased. For example, when they are housed in a container of 3.8×3.8 mm or less in plane size required, more recently, the size of elements is made to be 2×3 mm, therefore the sum M+N of the number of pairs of electrode fingers of the SAW filters (M) and the number of conductors of one-side reflectors (N) must be made to be about 200 or less. It lowers the Q value of the SAW resonators (the resonance sharpness), decreases the excitation intensity of resonance amplitude and displacement transmission coefficient and deteriorates the transmission characteristics of the SAW filters.

Furthermore, the thickness of electrode films should be thickened to remedy a deficiency in the number of conductors of the reflectors and improve the insertion loss, but it increases the spurious level of longitudinal and transversal higher modes and deteriorates the degree of suppression of the out-of-band frequency characteristics.

In Japanese unexamined patent publications No. H4-373304 and No. H9-93079, a transversely coupled triple-mode SAW filter in which three SAW resonators are disposed in a direction perpendicular to the propagation direction of SAW has been proposed to expand the passband without narrowing the electrode finger cross width of IDT. In this SAW filter, however, there is the problem that differences unavoidable in design between filter impedances of adjacent 1st and 2nd SAW resonators and the filter impedances of adjacent 2nd and 3rd SAW resonators occur, respectively, making it difficult to obtain practically good filter characteristics because this generates a ripple in the passband. Still more, in Clemens C. W. Ruppel et al.'s paper "SAW Devices for Mobile Communication Applications" (*The 26th Symposium of Electric Society & Electronic Circuit Technical Committee*, page 129–130 (1997)), a transversely coupled multi-mode SAW filter which enables an increase in the frequency difference between two modes, i.e., S0 (fundamental wave symmetric)—S1 (primary symmetric) modes and A0 (fundamental wave anti-symmetric)—A1 (primary anti-symmetric) modes by using these modes and consequently expanding the passband width has been disclosed. However, this SAW filter practically has a dispersion in design and in manufacture. It is feared that this is the reason why the A0 mode is excited to generate the ripple in the S0–S1 mode and why the S1 mode is excited to generate the ripple in the A0–A1 mode. There is also concern that the construction of electrode patterns including the disposition of input/output terminals is complicated, therefore the size of filter cannot be fully miniaturized.

Accordingly, this invention was made to overcome afore-the previous problems, and its purpose consists in providing a transversely coupled multi-mode SAW filter which enables to seek the broadening of passband width and the miniaturization.

Moreover, the purpose of this invention consists of providing a transversely coupled multi-mode SAW filter which has excellent frequency stability and good S/N ratio, and is suited to the use as an IF filter of mobile communication terminals such as portable telephone.

The inventors of this application discovered that the vibration displacement of a so-called transversal mode and the resonance frequency thereof can be calculated by use of a theory described below. This transversal mode is an inherent vibration mode which exists depending on the length of SAW resonators in the cross direction (the Y-axis direction perpendicular to the propagation direction X axis of SAW), and the length in the cross direction generally means the electrode finger cross width WC of IDT, i.e., the dimension of a portion where electrode fingers of positive polarity and electrode fingers of negative polarity overlap each other in the cross direction.

As a method for simply calculating the vibrational displacement of SAW resonators in the cross direction, the inventors of this application have published a differential equation dominating the transversal modes in a paper "K-cut quartz crystal SAW resonators having dynamic and static zero-temperature coefficients at normal temperature" (Takagi, Momosaki et al., *the 25th EM Symposium of*

*Electric Society & Electronic Circuit Technical Committee*, page 77–83 (1996)). This equation is described as the following Eq. (1).

$$a\omega_0^2(Y)V(Y),_{YY}+\{\omega_0^2(Y)\}V(Y)=0 \quad (1)$$

Here, $\omega$ is the angular frequency, $\omega_0(Y)$ is the angular frequency of element in the region, a is the effective shear rigidity constant in the cross direction, V(Y) is the amplitude of displacement of surface acoustic wave in the cross direction, and Y is the Y-coordinate specified by the wavelength of the surface acoustic wave. Moreover, $\omega_0(Y)$ is a quantity given by converting the speed of the surface acoustic wave at the coordinate Y to the angular frequency, and is called the frequency potential function.

It has been confirmed that this frequency potential function changes with a function of the thickness H(Y) of aluminum metal conductor film existing in the propagation path of a surface acoustic wave in the vicinity of operating points of SAW resonators and, more generally, changes with a function of the mass m (Y) of aluminum metal. The $\omega_0(Y)$ at the IDT forming the principal part of the SAW resonators is roughly determined by the mass m(Y) of IDT. Namely, the speed of the surface acoustic wave at a coordinate Y can be described as $\omega_0(m(Y))$. When the employed piezoelectric substrate is quartz crystal ST-cut, the film thickness of IDT is thin, therefore the $\omega_0(Y)$ linearly falls in a rough proportion to m.

The Eq. (1) is a Helmhortz equation when the wavenumber is a function of position, if it is divided by a frequency $\omega_{00}^2$ based on the whole equation to simplify the calculation, then the equation can be written as the following Eq. (2).

$$aQ^2(Y)V(Y),_{YY}+\{\Omega^2-Q^2(Y)\}V(Y)=0 \quad (2)$$

Here, $\Omega Q=\omega/\omega_{00}$ is the specified frequency, and $Q(m(Y))=\omega_0(Y)/\omega_{00}$ is the potential function.

The vibrational displacement amplitude V(Y) can be calculated, e.g., by successive integration as follows.

$$V(Y,\Omega) = \int_0^Y V(Y),_y dY + C \text{ (constant)} \quad (3)$$

however, $$(V(Y,\Omega))_{,Y} = -\int_0^Y \{\Omega^2 - Q^2(Y)\}V(Y)/aQ^2(Y)dY$$

The V(Y, $\Omega$) of Eq. (3) is a function of the specified frequency $\Omega$, but the actual vibrational displacement amplitude is realized at $\Omega$ given by the following Eq. (4) being the stationary principle of energies because the total integral quantity with respect to Y of $V^2(Y, \Omega)$ being the square of the amplitude is the total energy of the resonator.

$$\partial(2E(\Omega))/\partial\Omega = \partial\left(\int_0^\infty V^2(Y,\Omega)dY\right)\Big/\partial\Omega = 0 \quad (4)$$

Because the resonance frequency of the fundamental wave and higher modes of a transversally coupled double-mode SAW filter can be accurately calculated by using design conditions such as dimensions, film thickness of electrode pattern of the SAW filter based on the above theory, the inventors of this application thought of the use of S1·A1 modes which was previously considered to be unusable in common sense because a resonance of S0 mode and A0 mode of the strongest fundamental wave generated as spuroius modes, thus they devised this invention.

This invention provides a transversally coupled double-mode SAW filter and

Two SAW resonators, which have curtain-like electrodes and a pair of reflectors on both sides thereof, respectively, are disposed in parallel on a piezoelectric flat plate in the propagation direction of a surface acoustic wave.

The curtain-like electrodes of the SAW resonators have a first bus bar of electrically positive electrode which extends in the propagation direction and second and third bus bars of electrically negative electrode which extend in parallel to both sides of the first bus bar.

The first bus bar has multiple electrode fingers of electrically positive electrode which face to the second and third bus bars on both sides thereof, and which extend in a direction perpendicular to the propagation direction.

The second and third bus bars have multiple electrode fingers of electrically positive electrode which correspond to the electrode fingers of electrically positive electrode, which face to the first bus bar and which extend in a direction perpendicular to the propagation direction.

Thereby, the curtain-like electrodes are constituted to invert the direction of driving electric field by 180° with the first bus bar therebetween, and the primary symmetric mode S1 and primary anti-symmetric mode A1 can be excited.

By such a construction, the transmission characteristics of the transversally coupled double-mode resonator type SAW filter are not a fundamental wave but are synthesized from the primary symmetric mode S1 and primary anti-symmetric mode A1 which belong to higher transversal modes, thus a frequence difference between S1·A1 modes, i.e., passband width sharply broader than before can be obtained. Moreover, the generated charges of S0·A0 modes are cancelled to suppress the excitation of these modes, and the generated charge of S2 mode is offset to suppress the excitation of this mode, thus the spurious level of S2 mode which was difficult to be suppressed before is as low as 40 dB or below, therefore no ripple occurs in the passband, and this filter is especially suitable as an IF filter of mobile communication terminals with relatively large frequency width between channels of PHS, GSM mode, etc. in practice.

Moreover, because the IDT consisting of 180° inverted electrodes for driving the S1·A1 modes in a good efficiency takes a large electrode finger cross width of up to 8λ to 12λ and integrates the generated charges of S1·A1 modes in a good efficiency without offset, as a result, it enables a decrease in the equivalent resistance of the SAW resonators and improves the insertion loss. Furthermore, such an electrode pattern takes a periodic sequence structure in the propagation direction of SAW, no unreasonableness of wiring in design and does not harm the Q value of the resonators, therefore the miniaturization of elements is easy.

Particularly, the electrode fingers of electrically positive and negative electrodes of the SAW resonators are preferably formed and connected so as to have a periodic space of λ/2 (λ: the wavelength of a surface acoustic wave) and a width of λ/4 for the bus bars.

In one embodiment, the excitation of SAW caused by common noises (voltage) between input/output terminals can be prevented and a good use condition for the noises can be realized by forming the input-side curtain-like electrodes of the SAW resonators into a differential type having input terminals on the anode side and the cathod side which are electrically separately from the ground.

In another embodiment, an electrostatic shielding effect for cutting-off electrostatic coupling noises, i.e., a voltage transmitted from the input to the output via a floating electrostatic capacitance is obtained by forming a one-side grounding input terminal pair consisting of an anode side input terminal electrically separated from the ground and a cathode side input terminal connected to the ground on the output-side curtain-like electrode of the SAW resonators, thus this is convenient.

To secure a bandwidth of 1,000 ppm, it is more preferable that the curtain-like electrodes of the two SAW resonators approaching each other are separated by a gap length E of 2.5 to 5 μm, and/or the finger cross width of electrode fingers of electrically positive and negative electrodes of the curtain-like electrodes is set within a range of 4λ to 6λ.

More specifically, the planar area of elements can be reduced to about a half as compared to before, small good SAW filters can be realized and can correspond to the miniaturization of mobile communication terminals such as portable telephone by designing the number of pairs of curtain-like electrodes of the SAW resonators in a range as small as 120 to 60 and the number of conductors of one-side reflectors in a range as small as 80 to 140.

Moreover, if the piezoelectric flat plate is a quartz crystal substrate and is a ST-cut X transmission orientation of 30–45° rotated Y plate, the frequency-temperature characteristics are highly accurate, the frequency changes in the use temperature range are small and are stabilized, thus this is convenient.

Furthermore, in one embodiment, the out-of-band attenuation can be secured by two-stage cascade connection of aforesaid transversally coupled double-mode SAW filter, thus this is convenient.

BRIEF

DETAILED DESCRIPTION OF THE EMBODIMENTS

The transversally coupled double-mode SAW filter based on this invention is illustrated in detail by specific embodiments designed by using the above Eqs. (1) to (4).

Figure 1:
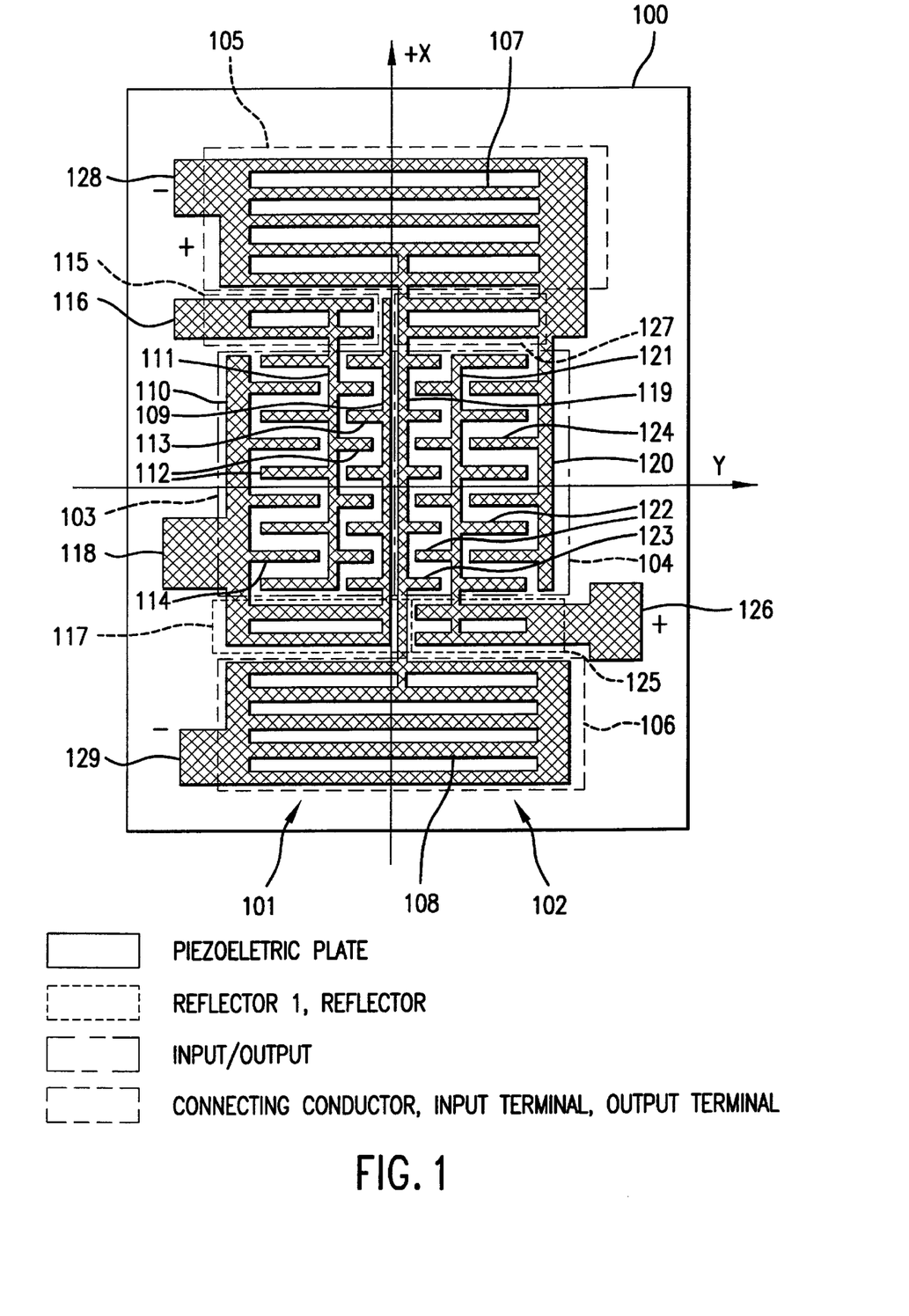
FIG. 1 is a block diagram showing one embodiment of a transversally coupled double-mode SAW filter based on this invention.

FIG. 1 shows an electrode pattern used in one embodiment of the transversally coupled double-mode SAW filter based on this invention. In the SAW filter of this embodiment, two SAW resonators 101, 102 are disposed in parallel on a retangular piezoelectric flat plate 100 in a direction transverse to the direction of Y axis perpendicular to the X axis being the propagation direction of a surface acoustic wave. The SAW resonators 101, 102 have curtain-like electrodes (IDT) shown by a frame of dashed lines roughly at the center, respectively. Reflectors of the SAW filters 105, 106 which are also a pair of reflectors of the SAW resonators are disposed as shown by frames of dashed lines. The reflectors 105, 106 have groups of conductor strips 107, 108 made of aluminum metal for reflecting the surface acoustic wave, respectively.

The IDT 103, 104 of the SAW resonators 101, 102 are so disposed as to have mutually inverted polarities. One IDT 103 has a cathode-side bus bar 109 near to the center of the piezoelectric flat plate 100 extending along the X axis, an outer cathode-side bus bar 110 parallel thereto and an anode-side bus bar 111 disposed between them. Many electrode fingers 112 alternately extend out from the anode-side bus bar 111 to the cathode-side bus bars 109, 110 of both of its sides, and many electrode fingers 113, 114 paired therewith alternately extend out from the cathode-side bus bars 109, 110 to the anode-side bus bar 111. The anode-side bus bar 111 and the electrode fingers 112 connect with an anodic input terminal 116 of the SAW resonator 101 via a connection conductor 115 shown by a frame of dashed lines, the cathode-side bus bars 109, 110 and the electrode fingers 113, 114 connect with an grounded cathodic input terminal 118 of the SAW resonator 101 via a connection conductor 117 shown by a frame of dashed lines.

The other IDT 104 similarly has a cathode-side bus bar 119 near to the center of the piezoelectric flat plate 100 extending along the X axis, an outer cathode-side bus bar 120 parallel thereto and an anode-side bus bar 121 disposed between them. Many electrode fingers 122 alternately extend out from the anode-side bus bar 121 to the cathode-side bus bars 119, 120, and many electrode fingers 123, 124 paired therewith alternately extend out from the cathode-side bus bars 119, 120 to the anode-side bus bar 121. The anode-side bus bar 121 and the electrode fingers 122 connect with an anodic input terminal 126 of the SAW resonator 102 via a connection conductor 125 shown by a frame of dashed lines, the cathode-side bus bars 119, 120 and the electrode fingers 123, 124 connect with a grounded cathodic output terminal 128 of the SAW resonator 102 via a connection conductor 127 shown by a frame of dashed lines and a group of conductor strips 107 forming one reflector 105. The cathode-side bus bars 119, 120 and the electrode fingers 123 further connect with an grounded cathodic input terminal 129 via a group of conductor strips 108 forming the opposite reflector 106. Moreover, input/output signals are certainly high-frequency alternating-current signals, here one is called the anode and the other is called the cathode for convenience.

The electrode fingers of the IDT and the groups of conductor strips of the reflectors are perpendicular to the phase progress direction (the X axis direction) of surface acoustic waves such as employed Raleigh wave and Ritchie wave and are disposed periodically and parallel to each other. These electrode patterns of the IDT and reflectors are made by forming a thin film of conductive metals such as aluminum or gold on the piezoelectric flat plate by deposition, sputtering, etc. and then forming the patterns by photolithographic technique.

Figure 3:
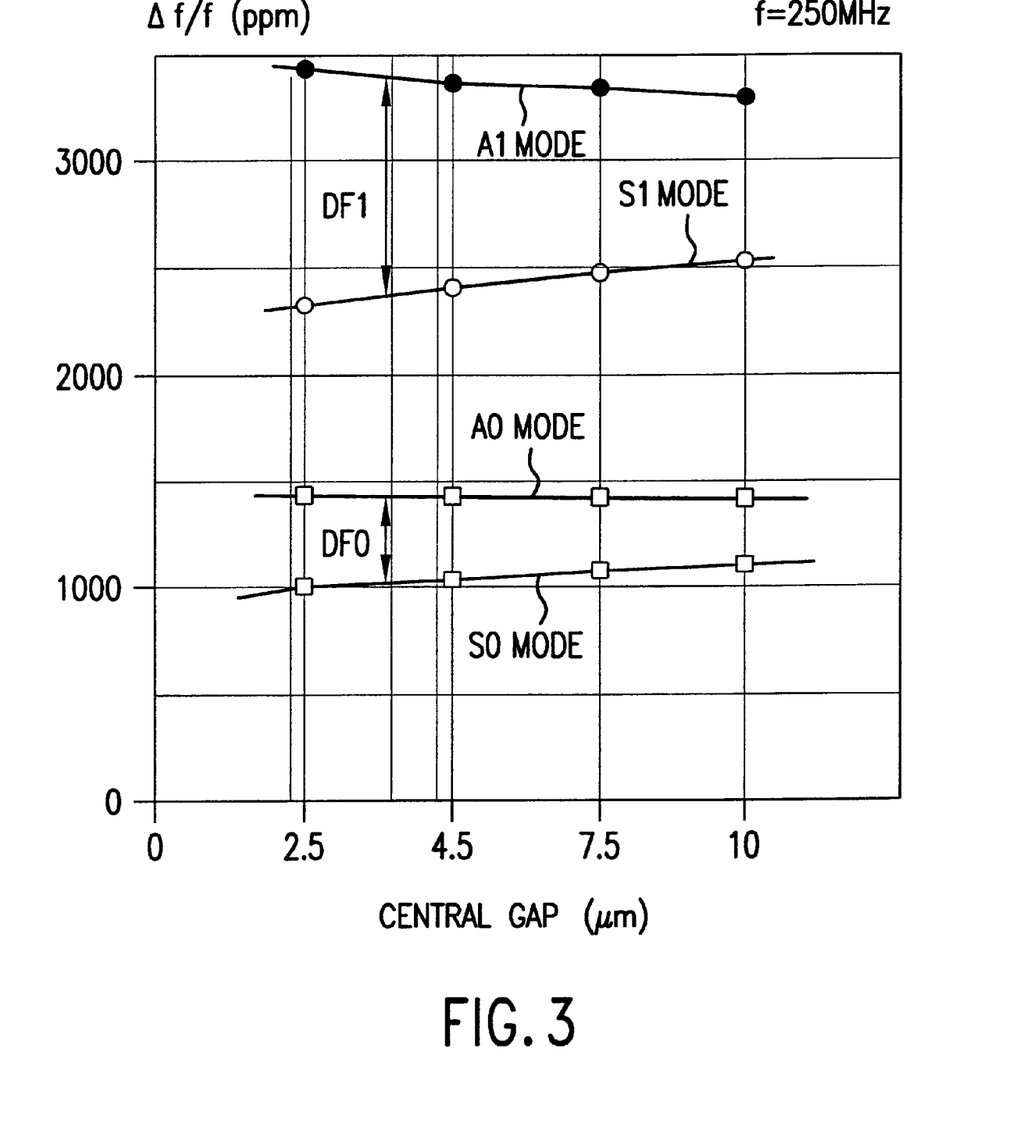
FIG. 3 is a diagram showing the resonance frequency of vibration modes with respect to change of central gap E in the transversally coupled double-mode SAW filter of FIG. 1.

Thus, the IDT 103, 104 of the SAW resonators 101, 102 have the electrode fingers 112, 122 of electrically positive electrode of about $\lambda/4$ in width formed by a steric positional slippage of $\lambda/2$ ($\lambda$: the wavelength of SAW) on both sides of the electrically positive bus bars 111, 121 in which the rough center in the cross direction is cut longitudinally along the propagation direction of SAW, respectively and have the electrode fingers 113, 114, 123, 124 of electrically negatice electrode of about $\lambda/4$ in width formed by a steric positional slippage of $\lambda/2$ opposite thereto similarly and are so constituted by 180° inverting the direction of the driving electric field, therefore, the primary symmetric mode S1 and the primary anti-symmetric mode A1 as described later in relation to FIG. 3 can be excited.

As described above, the input-side IDT 103 is a so-called balanced construction capable of differential operation in which the anode-side and cathode-side electrode fingers 112–114 also do not connect with any of grounded terminals (GND) 128, 129. It has such an advantage that the SAW is not excited and the SAW filter does not operate even if a voltage of same value is applied as common noises to the input-side terminals 116, 118 as is evident from the fact that, for example, the driving field does not act between the positive and negative electrode fingers.

On the other hand, the output-side IDT 104 is a so-called non-differential or unbalanced construction in which the cathode-side output terminal 128 is grounded as described above. It has such advantage that a voltage transmitted from the input side to the output side via the floating electrostatic capacitance is cut off to give an electrostatic shielding effect for separating the electrostatic coupling noises. As a result, the out-of-band attenuation characteristics of the SAW filter can be improved.

The piezoelectric flat plate 100 of this embodiment can be formed with a substrate where a single-crystal having the piezoelectricity such as quartz crystal, lithium tantalate, lithium tetraborate, langasite crystal and a piezoelectric thin film such as ZnO are formed. A quartz crystal ST-X propagation cut substrate of a 30–45° rotated Y plate is more preferable from the fact that the frequency-temperature characteristics are good and highly accurate, and frequency changes in use temperature range are small and are stabilized.

Figure 2:
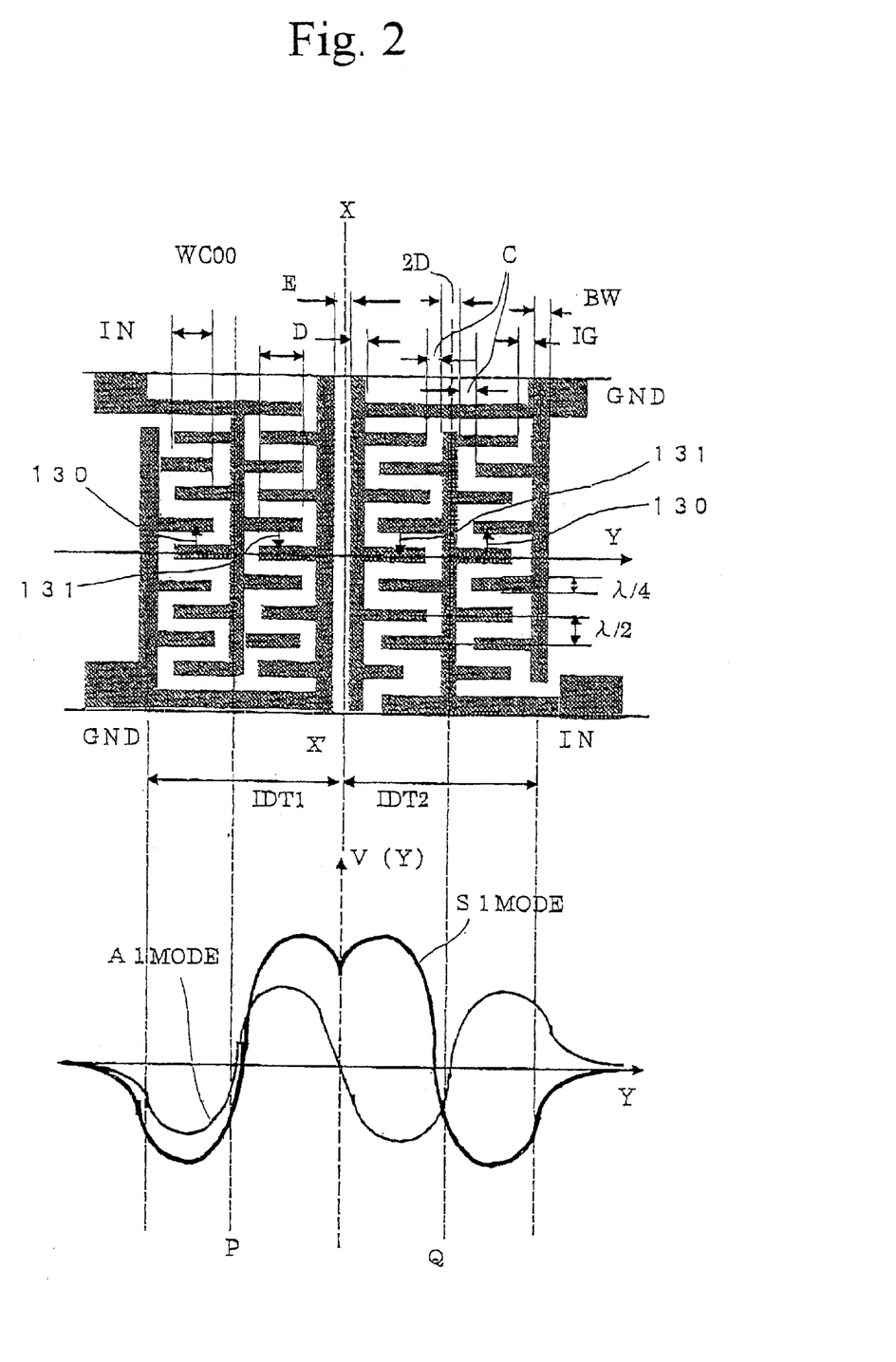
FIG. 2 is a diagram showing the relationship between excitation part of the transversally coupled double-mode SAW filter of FIG. 1 and displacement of vibration modes S1, A1 using the same in the cross direction.

Next, the cross displacement V(Y) of vibration modes of the transversally coupled double-mode SAW filter of FIG. 1 is illustrated by using FIG. 1 and FIG. 2. In the transversally coupled double-mode SAW filter of FIG. 1, if an electric signal (a voltage) from external is applied between the anode-side input terminal 116 and the cathode-side input terminal 118 of the input-side SAW resonator 101, this applied voltage is supplied to the anode-side electrode fingers 112 via the middle anode-side bus bar 111. Thereby, the SAW is excited on the input-side IDT 103 along the X axis direction. Then, the SAW is excited on the output-side IDT 104 along the X axis direction by this acoustical coupling, thus an electric signal (a voltage) is output between the anode-side output terminal 126 and the the cathode-side output terminal 128 of the output-side SAW resonator 102 by a piezoelectric effect.

As shown in FIG. 2, exciting fields reversely generate on the IDT 103 and 104 as shown by upward and downward arrows 130, 131 on both sides in the cross direction of the bus bars 111, 121 in positions of their electrode fingers, respectively. Vibrational displacements of the primary symmetric mode S1 and primary anti-symmetric mode A1 as shown in the lower part of FIG. 2 generate due to these driving fields which are 180° inverted to each other. Here, the vertical axis indicates the relative displacement V(Y) and the horizontal axis indicates the position Y in the cross direction, respectively in the figure. As is evident from the same figure, the SAW filter of this embodiment is characterized by that displacements V(Y) at central positions P, Q of the IDT 103, 104 are roughly zero for the both modes S1, A1, which enables an efficient excitation of the both modes S1, A1.

Figure 4:
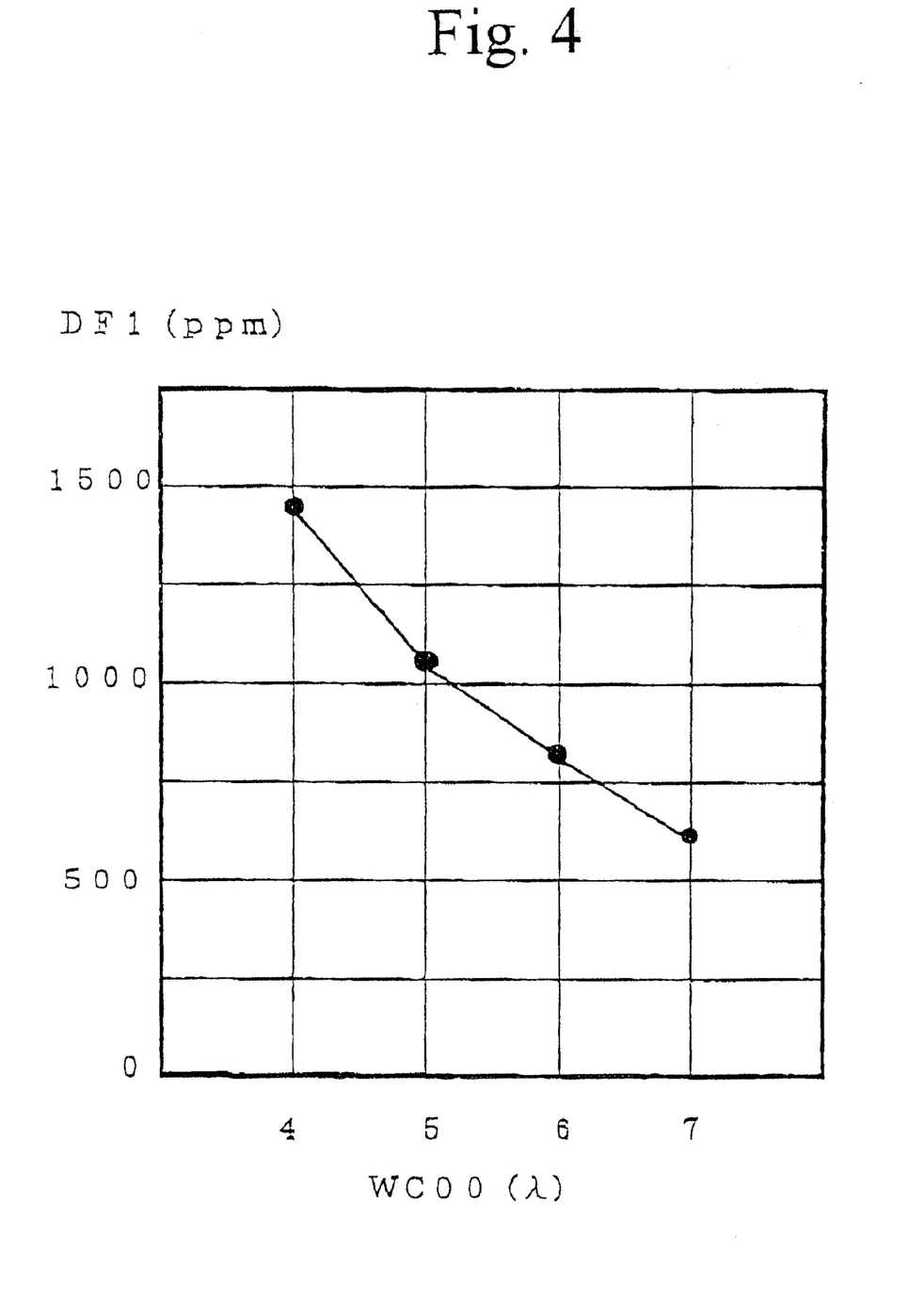
FIG. 4 is a diagram showing the frequency difference of vibration modes A1, S1 with respect to the change of the electrode finger cross width WC00 in the transversally coupled double-mode SAW filter of FIG. 1.
Figure 5:
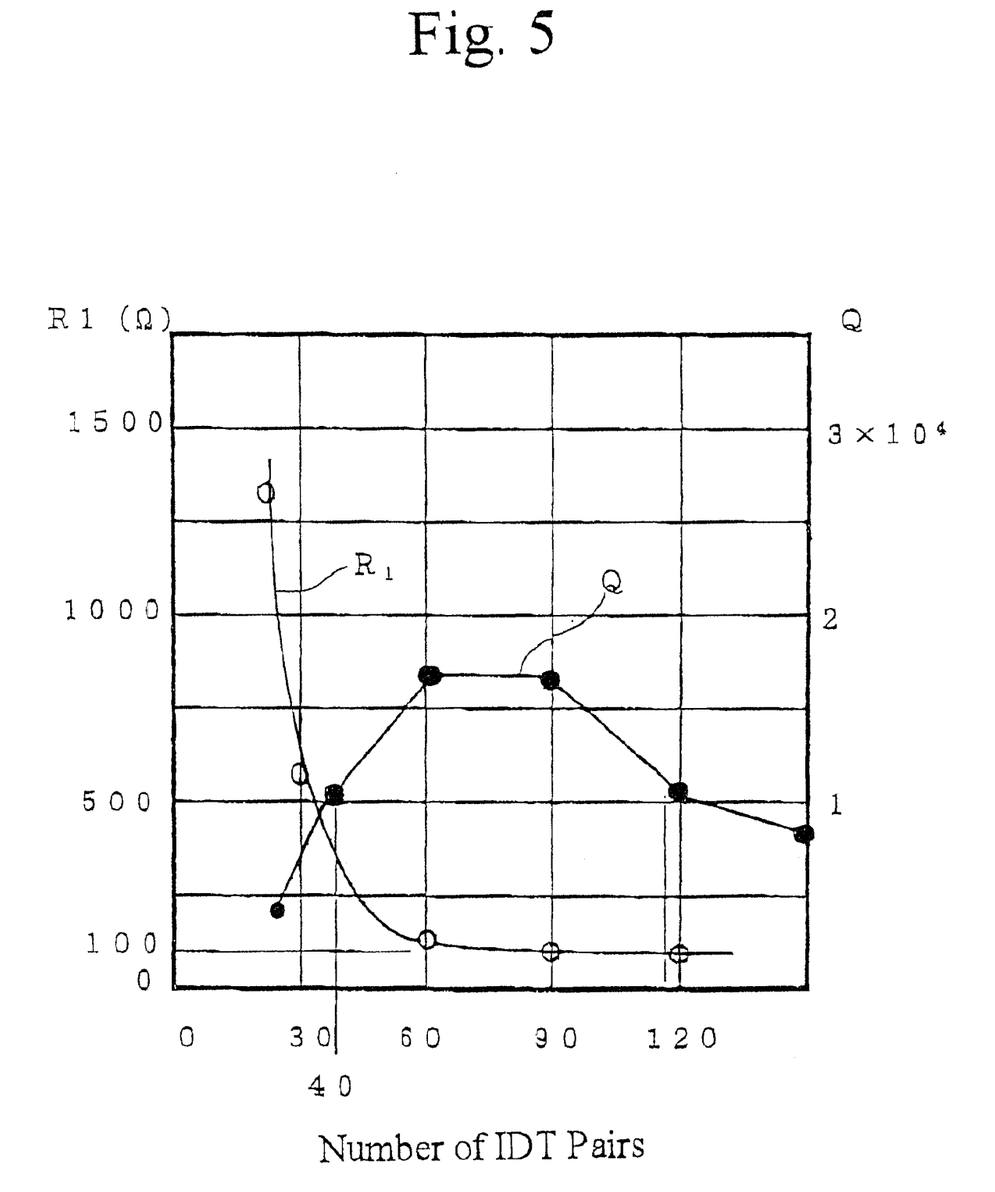
FIG. 5 is a diagram showing the relationship between equivalent constant of SAW resonators used in the transversally coupled double-mode SAW filter of FIG. 1 and number of pairs of IDT.

Next, one dimension design example of a specific conductor pattern of the transversally coupled double-mode SAW filter in the embodiment shown in FIG. 1 is illustrated by using FIG. 3 to FIG. 5. In FIG. 2, a reference symbol E means the gap length for separating both IDTs, D and 2D mean the widths of the nearly central and middle bus bars, C and IG mean division gaps between electrode fingers and adjacent bus bars, BW means the width of outer bus bar, and WC00 means the electrode finger cross width having mutually inverted polarities as described above.

First, when the gap length E and the electrode finger cross width WC00 are changed, the characteristics shown by the embodiment of FIG. 1 are shown in FIG. 3 and FIG. 4. As common design conditions here, the piezoelectric flat plate 100 is a quartz crystal ST-X propagation cut substrate consisiting of 30–45° rotated Y plate, IG=$2\lambda$ ($\lambda$: the wavelength of SAW propagating in the X axis direction), BW=$2\lambda$, C=$2\mu m$, D=$4\mu m$, and the operating frequency f of elements generally is 250 Mhz near to the frequency of IF band SAW filter used in portable telephones of GSM mode or PHS mode, etc.

In FIG. 3, when the gap length E is changed from 2 to 10 $\mu m$ at the electrode finger cross width WC00=$5\lambda$, the resonance frequencies of S0 (fundamental wave symmetric mode), A0 (fundamental wave anti-symmetric mode) and S1 (primary symmetric mode), A1 (primary anti-symmetric mode) in a group of transversally inharmonic modes are calculated. As shown in FIG. 3, the frequency difference DF0 of A0 mode and S0 mode of the fundamental wave used in the conventional transversally coupled double-mode SAW filter is considerably smaller than the frequency difference DF1 of the A1 mode and S1 mode being primary modes, and is no more than 500 ppm.

In contrast, it is known that when the frequency difference DF1 of the A1 mode and S1 mode being primary modes based on this invention is used, the gap length E of both IDT should be taken as the range of 2.5 to 5 $\mu m$ to make the specific bandwidth of the filter to 1,000 ppm required by IF filters used by portable telephones of GSM mode or PHS mode.

In this case, the frequencies of the modes are calculated by taking a specified frequency potential function PYM(Y) having the regions equal to 1 and using the following Eq. (5) showing the relationship of $Q(Y)=\omega_0(Y)/\omega_{00}$ and PYM(Y) in the above Eq. (3), respectively. However, $\eta$ is taken as a value of 0.99 to 0.95.

$$\omega_0(Y)=\omega_{00}\{1/\eta+(1-1/\eta)PYM(Y)\} \quad (5)$$

Under this condition, the specified frequency potential function PYM(Y) can be given as follows. First, in a region constituted a periodic sequence of the electrode fingers represented by WC00, a surface acoustic wave receives a perturbation due to the periodic grid structure and reduces from the propagation velocity of free surface Vs to Vm. Therefore, the element angular frequency of the region $\omega_0(Y)=\omega_{00}$ (=$2\pi Vm/(2PT)$) is determined by corresponding it to Vm. Here, PT is the length of sequence period of the electrode fingers. It is easily understandable from the above Eq. (5) that PYM corresponding to this angular frequency $\omega_{00}$ is 1, PYM for the free surface is 0, and the angular frequency in this case becomes $\omega_{00}$ $(1/\eta)(>\omega_{00})$ Therefore, the $\eta$ is the frequency dropping coeffcient.

The bus bar portions shown by D, 2D, BW in FIG. 2 are taken as somewhat smaller as 500–1,000 ppm than the velocity Vs of the free surface by judgement from the velocity of a obtained by FEM analysis in the case of overall coverage, therefore it corresponds to PYM=0.1 ((0.001=1/0.99–1)×PYM). An area C in the figure is regarded to be a velocity reduction of 0.25 and thus PYM=0.25 because ¼ of the number of electrode fingers crosses with the propagation path of the surface acoustic wave. Then, the displacement V(Y) of a transveral mode generated by the above specified frequency potential function PYM(Y) is the S1 mode and A1 mode shown in the lower part of FIG. 2.

FIG. 4 shows a characteristic of the frequency difference DF1 of the A1 mode and S1 mode when the electrode finger cross width WC00 is changed from 4λ to 7λ with the gap length E=4 $\mu$m in FIG. 2. As is evident from the same figure, the DF1 can be roughly taken as a value of 1,500 to 1,000 ppm in the range of WC00=4λ to 5λ. This DF1 corresponds to the range of WC00=4λ to 5λ in the condition of gap length E, therefore DF1=1,000 ppm is said to be fine if WC00=4λ to 5λ roughly. Moreover, if WC00=4λ to 6λ, DF1=750 to 1,500 ppm, therefore a broader passband width than before can be obtained.

The relationship between the number of pairs of IDT (M) and the equivalent constants showing two SAW resonators used in the transversally coupled double-mode SAW filter of this embodiment is shown in FIG. 5. Here, the frequency of the SAW resonators was similarly taken as 250 Mhz as described above. At this frequency, the sum of number of pairs of IDT (M) and number of conductors of one-side reflectors (N) must be made to be within 200 to house them in about 2×3 mm which is the minimum element size thought to be preparable with quartz crystal substrate.

Here, it has been known that in a one-port SAW filter having IDT where many electrode fingers perpendicular to the phase propagation direction of a surface acoustic wave are periodically disposed and a pair of reflectors where many strip conductors are periodically disposed on both sides thereof on a piezoelectric flat plate, if the electrode fingers forming the IDT are taken as M pairs, the total reflection coefficient Γ for all the electrode fingers of IDT is defined as the following Eq. (6) and 10>Γ0.8, a so-called energy trapped type SAW resonator with vibration energy concentrated at the center of the resonator can be realized (see Suzuki, Kiyomizu, Yamanouchi : "Energy Trapped Type Resonator of Surface Acoustic Wave", Shingaku Kibo US 87–36, page 9–16 (September, 1987)).

$$\Gamma = 4MbH/\lambda \quad (6)$$

M is the number of pairs of IDT with an anode and a cathode as one pair, b is the reflection coeffcient of a surface acoustic wave per electrode, H is the film thickness of conductor, and λ is the wavelength of the surface acoustic wave.

For example, when IDT of aluminum conductors are formed on a ST-cut quartz crystal substrate, if b=0.255, H/λ=0.03 and M=80, a one-port SAW filter of FIG. 1 can be constituted, and it takes Γ=2.448 at this time. Therefore, the sum of number of pairs of IDT (M) and number of conductors of one-side reflectors (N) are about 200 to make the size of elements to 2×3 mm, if M=80 and the number of conductors of one-side reflectors N=200−M=120 are taken, it is considered possible to realize the miniaturization of size of elements.

FIG. 5 shows characteristics of the Q value (resonance sharpness) (black circle dots) related to the number of pairs of electrode fingers of IDT (M) of one SAW resonator and the equivalent series resonance resistance $R_1$ (white circle dots) under the above conditions. However, 8λ was used as the electrode finger cross width of one SAW resonator (equivalent to aforesaid WC00×2). In the same figure, the Q value becomes a value of about 10,000 or more in the range of number of pairs of IDT M=40 to 120, and R1 gives a value of 100 Ω in the range of M=60 to 120.

Therefore, it is known that the electrode finger cross width is WC00=4λ to 8λ and the number of pairs of IDT M=60 to 120 are taken to make the size of element to 2×3 mm and the sum of number of pairs of electrode fingers of IDT (M) and number of conductors of one-side reflectors (N) is about 200 as described above in this embodiment, if the number of conductors of reflectors is taken as 140 to 80, the characteristics being the purpose of this invention probably are obtained simultaneously with the miniaturization of elements.

Figure 6:
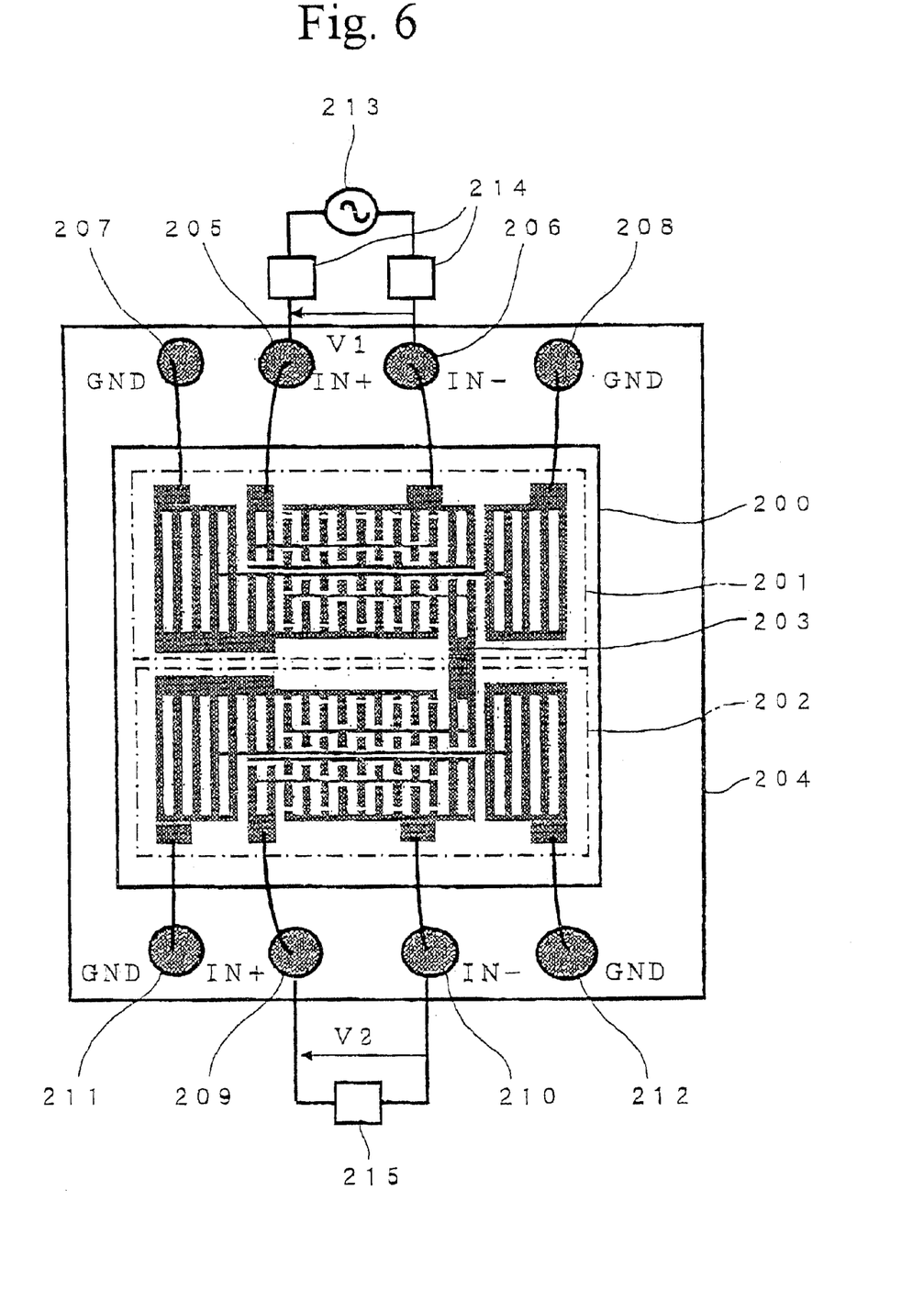
FIG. 6 is a block diagram showing one embodiment of a two-stage cascade connected transversally coupled double-mode SAW filter based on this invention.

FIG. 6 shows an embodiment where the transversally coupled double-mode SAW filter of FIG. 1 is in two-stage cascade connection. In a piezoelectric flat plate 200, the first transversally coupled double-mode SAW filter 201 and the second transversally coupled double-mode SAW filter 202 enclosed by frame of dash-lines are disposed, respectively, and the anodic output terminal of the first SAW filter 201 and the anodic input terminal of the second SAW filter 202 are connected by a conductor pattern 203 arranged near to the center.

In this embodiment, the whole body is then mounted in a package 204, the anodic input terminal, cathodic input terminal and cathodic output terminal of the first SAW filter 201 are connected to an input-side anodic terminal 205, a cathodic terminal 206 and ground terminals (GND) 207, 208 arranged at the package, respectively. The anodic output terminal, cathodic output terminal and cathodic input terminal of the second SAW filter 202 are connected to an output-side anodic terminal 209, a cathodic terminal 210 and ground terminals (GND) 211, 212 arranged at the package, respectively.

An electric signal source 213 is connected between the input-side anodic terminal 205 and cathodic terminal 206 via a matching circuit 214 of a first filter 201, and an terminal matching circuit 215 of a second filter 202 is connected between the output-side anodic terminal 209 and cathodic terminal 210. If a voltage between the input-side anodic terminal 205 and cathodic terminal 206 is taken as V1 and a voltage between the output-side anodic terminal 209 and cathodic terminal 210 is taken as V2, the transmission characteristics of the filters in this embodiment are usually obtained by 20 $\log_{10}$(V2/V1).

As with the embodiment of FIG. 1, the first and the second SAW filters 201, 202 take a non-differential or an unbalanced construction where the output-side cathodic terminals of IDT are grounded, respectively. This enables to expand the area of conductor patterns at the ground potential, therefore enables a display of the shielding effect between the input-side terminals 205, 206 of a first stage and the output-side terminals 209, 210 of a second stage, and cut off the voltage transmitted from the input side to the output side via the floating electrostatic capacity by grounding. Thus, the electromagnetic coupling between the first and second SAW filters is prevented, consequently such an effect is present that the out-of-band attenuation characteristics can be improved.

Figure 7:
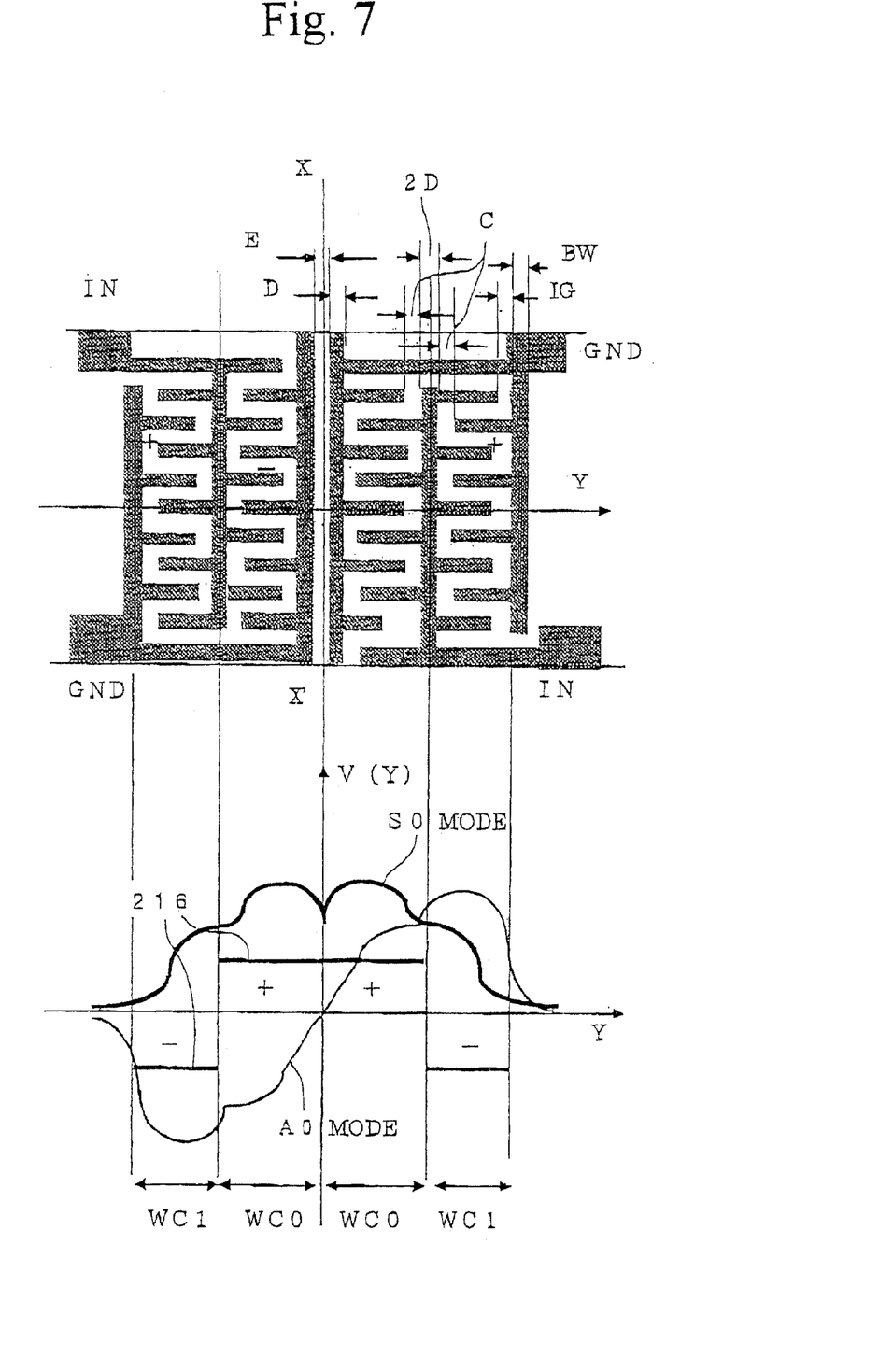
FIG. 7 is a diagram showing the relatioship between excitation portion of the transversally coupled double -mode resonator-type SAW filter of FIG. 6 and displacement of suppressed vibration modes S0, A0 in the cross direction.

FIG. 7 shows the IDT of one SAW filter in this embodiment and the cross displacement V(Y) of the S0 mode and A0 mode being the fundamental waves in the lower part, its vertical axis is the relative displacement V(Y) and the horizontal axis is the position in the cross direction Y.

Figure 8:
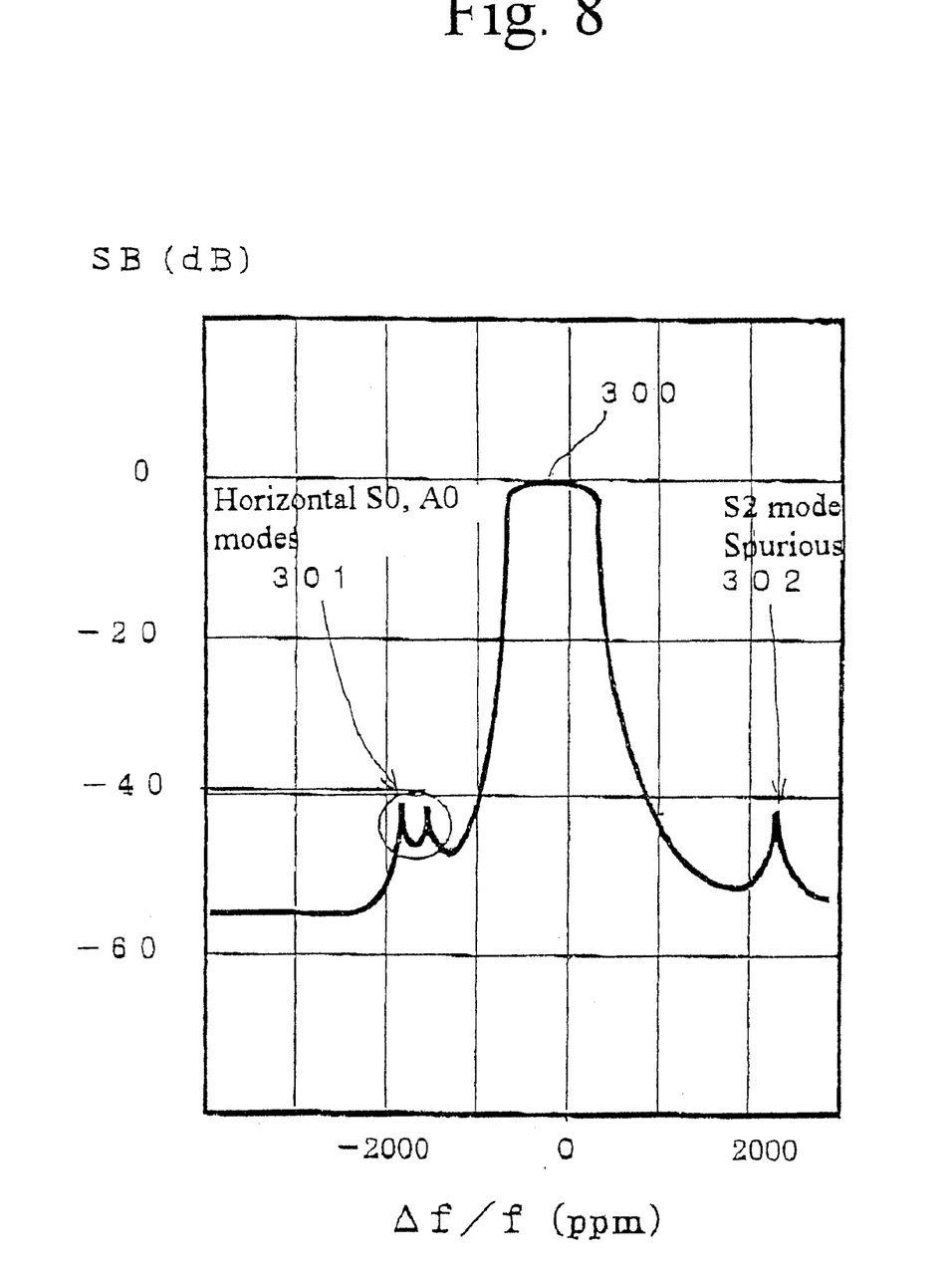
FIG. 8 is a diagram showing the transmission characterisitics of the transversally coupled double-mode SAW filter of FIG. 6.

FIG. 8 shows the transmission characteristics of the filters of this embodiment (the quantity of operating transmission SB=20 $\log_{10}$(V2/V1) (dB)). The vertical axis of FIG. 8 represents SB logarithmically and the horizontal axis represents the rate of frequency change Δf/f in ppm unit $10^{-6}$. In the figure, 300 is the passband width of 1,000 ppm made by aforesaid S1·A1 modes and is roughly consistent with the calculated value of FIG. 3. 301 is an unwanted mode made by the fundamental symmetric mode S0 and the fundamental anti-symmetric mode A0. 302 is an unwanted mode made by S2 mode which is a symmetric mode higher than S1 and is fully suppressed at 40 dB or more because it is a higher mode.

The transmission characteristics of FIG. 8 are relatively expressed with the vertex of the passband width as 0 dB, and the insertion loss of the SAW filters of this embodiment gives a value as good as 3 dB in the first stage and 6 dB in the second stage. It shows that the method of this invention in which the direction of driving field is 180° inverted in the IDT of the SAW filters is appropriate for the driving method of the primary symmetric mode S1 and the primary anti-symmetric mode A1.

The insertion loss of the SAW filters of this embodiment is 5 dB, and the unwanted mode 301 based on fundamental modes S0 and A0 resulted in an unexpectly low value. If the reason is explained in relation to FIG. 7, it is considered that the S0 mode and the A0 mode have displacements of the same polarity in the IDT regions of WC0 and WC1, therefore charges generaed in the electrode fingers 217, 218 which are so constituted as to become a polarity 180° inverted in the WC0 and WC1 regions as shown by symbols 216 offset by each other to present an electrically short-cut phenomenon, as the result, an energy loss is considered to generate and bring on a sharp decrease of the resonance sharpness (Q value) (from 2,000 to 20,000, −20 dB).

Moreover, if the relative excitation efficiency (the total amount of charges detected in IDT/the total amount of charges which should be obtained by the whole vibration displacement) for the modes is calculated, it becomes 0.1 in S0 and A0 modes and 0.75 in S1 and A1 modes. Therefore, it is considered that there is a suppression effect of 0.1/0.75= 0.133 (−17 dB), thus a suppression of −37 dB in all is realized.

Suitable embodiments of this invention are illustrated in detail above, but this invention can be carried out by adding various modifications and changes to the above embodiments as is evident for professionals. For example, the piezoelectric flat plate may be an LST-cut quartz crystal substrate being another 16° rotated Y plate or K-cut quartz crystal substrate being a 9.6° rotated Y plate, moreover, if design conditions are optimized, even smaller SAW filters can be realized though it is a piezoelectric material with a big electromechanical coupling coefficient above that of quartz crystal.

What is claimed is:

1. A transversally coupled double mode SAW filter, comprising:
    two SAW resonators which have curtain-like electrodes; and
    a pair of reflectors provided on both sides of the SAW resonators, respectively, the SAW resonators and the reflectors being disposed in parallel on a piezoelectric flat plate in a propagation direction of a surface acoustic wave,
    the curtain-like electrodes of said SAW resonators having a first bus bar of electrically positive electrode which extends in said propagation direction and a second bus bar and a third bus bar of electrically negative electrode which extend in parallel to both sides of said first bus bar,
    said first bus bar having multiple electrode fingers of electrically positive electrode which face said second bus bar and said third bus bar on both sides thereof and which extend in a direction perpendicular to said propagation direction,
    said second bus bar and said third bus bar having multiple electrode fingers of electrically negative electrode which correspond to said electrode fingers of electrically positive electrode, and said second bus bar and said third bus bar facing said first bus bar and extending in a direction perpendicular to said propagation direction, and
    said curtain-like electrodes inverting a direction of driving electric field by 180° with said first bus bar therebetween, a primary symmetric mode and a primary anti-symmetric mode being excited.

2. The transversally coupled double-mode SAW filter described in claim 1,
    said electrode fingers of electrically positive electrode and electrically negative electrode having a space of λ/2 between said first bus bar, said second bus bar and said third bus bar, and a width of λ/4 for said first bus bar, said second bus bar and said third bus bar, where λ is a wavelength of said surface acoustic wave.

3. The transversally coupled double-mode SAW filter described in claim 1, the curtain-like electrodes of an input-side SAW resonator of said SAW resonator having an anode-side input terminal and a cathode-side input terminal electrically separated from ground.

4. The transversally coupled double-mode SAW filter described in claim 1, the curtain-like electrodes of an output-side of said SAW resonator having an anode-side input terminal electrically separated from ground and a cathode-side input terminal connected to the ground.

5. The transversally coupled double-mode SAW filter described in claim 1, the curtain-like electrodes of said SAW resonators that are mutually approaching being separated by a gap length of 2.5 to 5 μm.

6. The transversally coupled double-mode SAW filter described in claim 1, a finger cross width of electrode fingers of electrically positive electrode and electrically negative electrode of said curtain-like electrodes being in a range of 4λ to 5λ.

7. The transversally coupled double-mode SAW filter described in claim 1, a finger cross width of electrode fingers of electrically positive electrode and electrically negative electrode of said curtain-like electrodes being in a range of 4λ to 6λ.

8. The transversally coupled double-mode SAW filter described in claim 1, a number of pairs of curtain-like electrodes of said SAW resonators being in a range of 60 to 120, and a number of conductors of said one-side reflectors being in a range of 80 to 140.

9. The transversally coupled double-mode SAW filter described in claim 1, said piezoelectric flat plate being a quartz crystal substrate and being in an ST-cut X propagation direction of a 30–45° rotated Y plate.

10. The transversally coupled double-mode SAW filter described in claim 1, said transversally coupled double-mode SAW filter being in a two-stage cascade connection.

* * * * *